US006594898B1

(12) United States Patent
Yun

(10) Patent No.: US 6,594,898 B1
(45) Date of Patent: Jul. 22, 2003

(54) METHOD OF MANUFACTURING AN INK JET PRINTER HEAD

(75) Inventor: Sang Kyeong Yun, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 180 days.

(21) Appl. No.: 09/596,144

(22) Filed: Jun. 16, 2000

(30) Foreign Application Priority Data

Dec. 22, 1999 (KR) .......................................... P99-60088

(51) Int. Cl.[7] ........................ B21D 53/76; H01L 21/302

(52) U.S. Cl. ............... 29/890.1; 29/25.35; 29/DIG. 16; 347/45; 347/71; 216/27; 438/21; 438/45; 438/705; 438/719; 438/720; 438/742; 438/753; 438/754

(58) Field of Search ............................ 29/25.35, 890.1, 29/DIG. 16, 847; 347/68, 70, 71, 45; 216/27; 438/21, 45, FOR 254, 705, 719, 720, 742, 753, 754

(56) References Cited

U.S. PATENT DOCUMENTS

| | | | | |
|---|---|---|---|---|
| 5,379,060 A | * | 1/1995 | Yoshimura | 347/71 |
| 5,459,501 A | * | 10/1995 | Lee et al. | 347/68 |
| 5,790,156 A | * | 8/1998 | Mutton et al. | 347/71 |

FOREIGN PATENT DOCUMENTS

| | | | | |
|---|---|---|---|---|
| JP | 2-169258 | * | 6/1990 | 347/45 |
| JP | 4005051 | | 1/1992 | |
| JP | 6106722 | | 4/1994 | |
| JP | 6238884 | | 8/1994 | |
| JP | 8142333 | | 6/1996 | |
| JP | 9136423 | | 5/1997 | |
| JP | 1067115 | | 3/1998 | |
| JP | 1128820 | | 2/1999 | |
| JP | 1-206632 | * | 8/1999 | 438/FOR 254 |

OTHER PUBLICATIONS

English Abstract of JP 9136423 publication date May 27, 1997.

English Abstract of JP 4005051 publication date Jan. 9, 1992.

English Abstract of JP 11028820 publication date Feb. 2, 1999.

English Abstract of JP 6106722 publication date Apr. 19, 1994.

English Abstract of JP 6238884 publication date Aug. 30, 1994.

English Abstract of JP 8142333 publication date Jun. 4, 1996.

English Abstract of JP 10067115 publication date Mar. 10, 1998.

* cited by examiner

*Primary Examiner*—A. Dexter Tugbang
(74) *Attorney, Agent, or Firm*—Staas & Halsey LLP

(57) ABSTRACT

A method of making ink jet printer head body provides a silicon wafer forming a restrictor plate over the silicon wafer by doping an impurity component. A nozzle plate is formed under the silicon wafer by doping an impurity component and a nozzle is formed by etching after the forming of the nozzle plate. A channel going through the restrictor plate and silicon wafer is formed by etching after the forming of the restrictor plate. The channel is formed of a wide upper portion and a narrow lower portion by patterning the silicon wafer and restrictor plate narrowly and etching the silicon wafer and restrictor plate, and then patterning the silicon wafer and restrictor plate widely and etching the silicon wafer and restrictor plate, except for the lower end of the silicon wafer. A restrictor at the restrictor plate is formed by etching after the patternings of the restrictor plate. One or more reservers continue to the restrictor under the restrictor by etching a definite thickness after the patternings of the silicon wafer.

10 Claims, 22 Drawing Sheets

METHOD OF MANUFACTURING AN INK JET PRINTER HEAD

BACKGROUND OF THE INVENTION

1. Field of the Invention

Present invention relates to a printer head and particularly to an ink jet printer head and a manufacturing method thereof.

2. Description of the Prior Art

Ink jet printer head is usually formed by sequential accumulation of nozzle plate 222 where nozzle 223 has been formed, reserver plate 221 where reserver 220 is formed, channel plate 219 where flow channel 218 is formed, restrictor plate 217 where restrictor 216 is formed, chamber plate 215 forming a chamber 214, and actuator composed of three parts of upper electrode 210, piezoelectric/electrostrictive film 211 and lower electrode 212 as in FIG. 1.

Ink travel path is formed in ink jet printer head by the above formation of such as nozzle 223, reserver 220, flow channel 218, restrictor 216, chamber 214 of mutually different sizes and shapes.

Ink supplied from ink canister (not shown in figure) is reserved in reserver 220 after which it flows into chamber 214 through flow channel 218 whence the reserver 220 formed between flow channel 218 and chamber 214 maintains ink flow speed into chamber 214 to a constant state.

Piezoelectric substance 211 is actuated if voltage is applied at upper electrode 210 and lower electrode 212 of actuator formed upon chamber 214; by which piezoelectric/electrostrictive film 211 actuation the chamber 214 volume momentarily decreases while chamber 214 ink is ejected through nozzle 223 formed at nozzle plate 222 onto material on which to be written. Printing is carried out by this ink jet.

Until now to manufacture an ink jet printer head as described above, use has been made of method of assembling after separately making a nozzle plate where nozzle is formed, a reserver plate where reserver is formed, a channel plate where channel is formed, a restrictor plate where restrictor is formed and a chamber plate where chamber is formed.

In this method, each plate comprising the ink jet printer head as above is manufactured by each separate process, and photoresist is coated on each of these separately manufactured plates which are then exposed to light, after which the guide holes are formed for assembling, then these plates are piled one upon another. Guide holes are fastened by screw etc. to fix the plates which are then thermally treated so that they are bonded together to finish the ink jet printer head.

In this traditional method, there is problem that yield percentage is low because there is large possibility to generate assembly tolerance error owing to inaccurate congruence of the guide hole positions and the plate sizes when assembling. And there is demerit of production cost rise because such photoresist should be used as is excellent in adhesion and low in reactivity with ink, which photoresist is to be coated before bonding the plates together.

SUMMARY OF THE INVENTION

Purpose of present invention to solve the above problem is to provide method of making ink jet printer head by integratedly molding using a silicon process and to present ink jet printer head made thereby.

Present invention to achieve the above purposes relates method of making ink jet printer head body comprising a step to provide silicon wafer; a step to form restrictor plate over the silicon wafer by doping impurity component; a step to form nozzle plate under the silicon wafer by doping impurity component, electroplating a metal or forming a polysilicon layer; a step to form nozzle by etching after patterning the above nozzle plate; a step to form channel going through the restrictor plate and the silicon wafer by etching after patterning the restrictor plate and the silicon wafer; a step to form restrictor at the restrictor plate by etching after patterning the restrictor plate; and a step to form one or more reservers continued to restrictor under the restrictor by etching definite thickness after patterning the silicon wafer.

And the invention relates method of making ink jet printer head body comprising a step to provide silicon wafer; a step to form restrictor plate over the silicon wafer by doping impurity component; a step to form channel going through the restrictor plate and the silicon wafer by etching after patterning the restrictor plate and the silicon wafer; a step to form restrictor at the restrictor plate by etching after patterning the restrictor plate; a step to form one or more reservers continued to restrictor under the restrictor by etching definite thickness after patterning the silicon wafer; a step to form photoresist layer under the silicon wafer; a step to leave photo resist only at nozzle part by patterning the photoresist layer; a step to form nozzle plate by electroplating a metal under the silicon wafer; and a step to form nozzle by removing photoresist.

And the invention relates ink jet printer head body comprising a channel plate made of silicon wafer; a restrictor plate formed over the silicon wafer by doping impurity component; a nozzle plate formed under the silicon wafer by doping impurity component, electroplating a metal or forming a polysilicon layer; a nozzle formed at the nozzle plate through which nozzle the ink is jetted; a channel going through the channel plate and the restrictor plate which channel is ink path; a restrictor formed at restrictor plate which restrictor maintains ink speed to be constant; and a one or more reservers continued to restrictor under the restrictor which reservers are formed at a part of the channel plate and in which reservers the ink is reserved.

And the invention relates method of making ink jet printer head comprising a step to provide silicon wafer; a step to form restrictor plate over the silicon wafer by doping impurity component; a step to form nozzle plate under the silicon wafer by doping impurity component, electroplating a metal or forming a polysilicon layer; a step to form nozzle by etching after patterning the above nozzle plate; a step to form channel going through the restrictor plate and the silicon wafer by etching after patterning the restrictor plate and the silicon wafer; a step to form restrictor at the restrictor plate by etching after patterning the restrictor plate; and a step to form one or more reservers continued to restrictor under the restrictor by etching definite thickness after patterning the silicon wafer; a step to separately form actuator composed of upper electrode, piezoelectric/electrostrictive film, lower electrode, vibration plate, chamber and chamber plate; and a step to bond the restrictor plate and the actuator.

And the invention relates method of making ink jet printer head comprising a polysilicon step to provide silicon wafer; a step to form restrictor plate over the silicon wafer by doping impurity component; a step to form channel going through the restrictor plate and the silicon wafer by etching after patterning the restrictor plate and the silicon wafer; a step to form restrictor at the restrictor plate by etching after patterning the restrictor plate; a step to form one or more reservers continued to restrictor under the restrictor by etching definite thickness after patterning the silicon wafer; a step to form photoresist layer under the silicon wafer; a step to leave photoresist only at nozzle part by patterning the photoresist layer; a step to form nozzle plate by electroplating a metal under the silicon wafer; a step to form nozzle by removing photoresist; a step to separately form actuator composed of upper electrode, piezoelectric/electrostrictive film, lower electrode, vibration plate, chamber and chamber plate; and a step to bond the restrictor plate and the actuator.

And the invention relates ink jet printer head comprising a channel plate made of silicon wafer; a restrictor plate formed over the silicon wafer by doping impurity component; a nozzle plate formed under the silicon wafer by doping impurity component, electroplating a metal or forming a polysilicon layer; a nozzle formed at the nozzle plate through which nozzle the ink is jetted; a channel going through the channel plate and the restrictor plate which channel is ink path; a restrictor formed at restrictor plate which restrictor maintains ink speed to be constant; one or more reservers continued to restrictor under the restrictor which reservers are formed at a part of the channel plate and in which reservers the ink is reserved; a chamber plate formed upon the restrictor plate; a chamber formed at the chamber plate; a vibration plate formed upon the chamber plate; a lower electrode formed upon the vibration plate; a piezoelectric/electrostrictive film formed upon the lower electrode so that this film actuates when electrified; and an upper electrode formed upon the piezoelectric/electrostrictive film.

DETAILED DESCRIPTION

Figure 1:
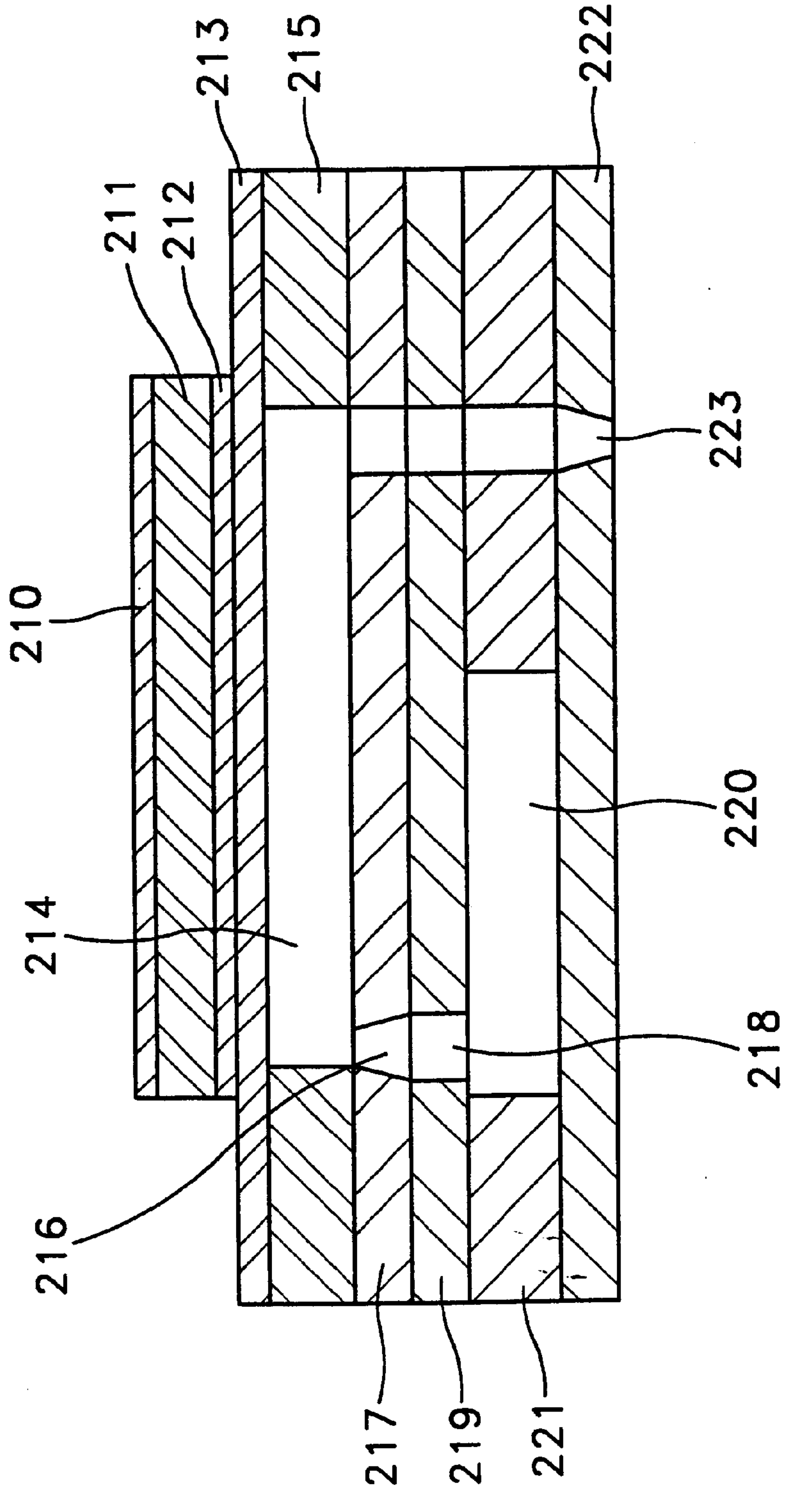
FIG. 1 (PRIOR ART)
FIG. 1 is a cross section view of general ink jet printer head.
Figure 2:
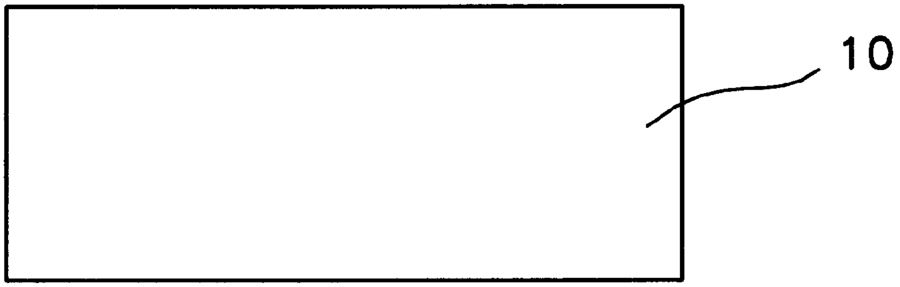
FIG. 2 through FIG. 9 represent flow diagrams showing an example of the present invention.
Figure 3:
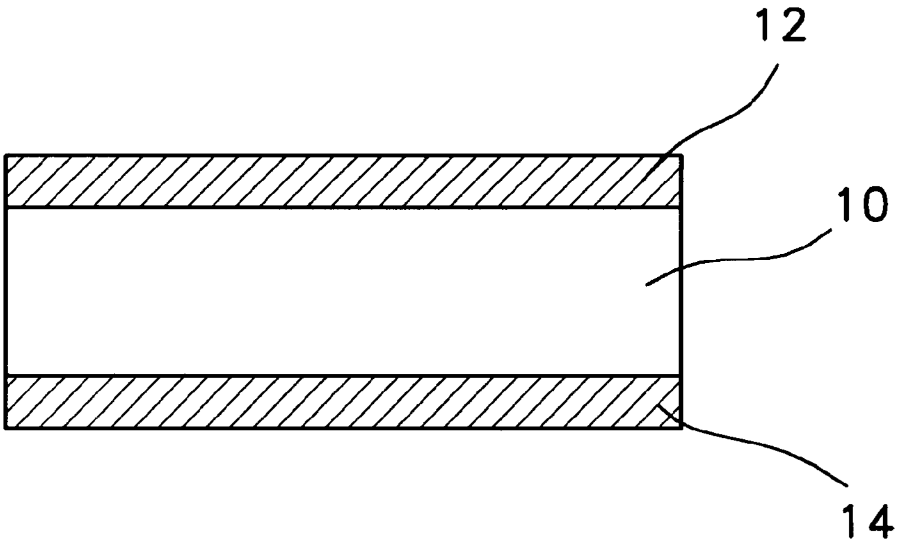
Figure 4:
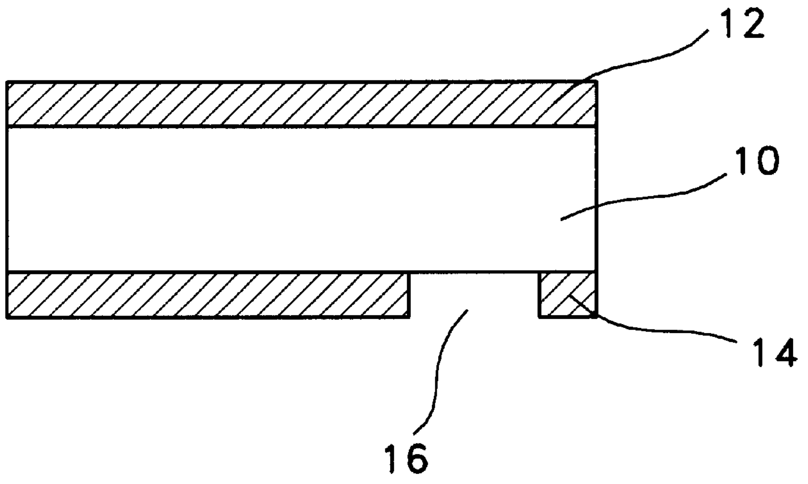
Figure 5:
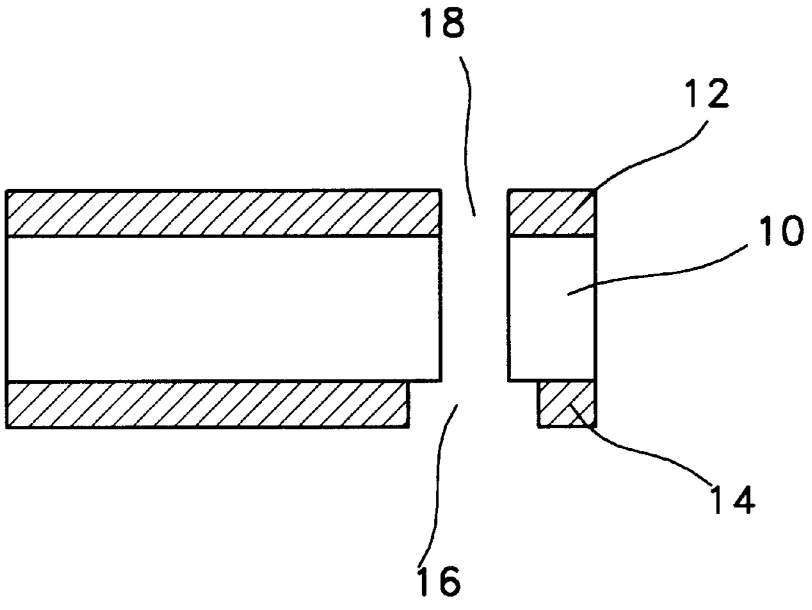
Figure 6:
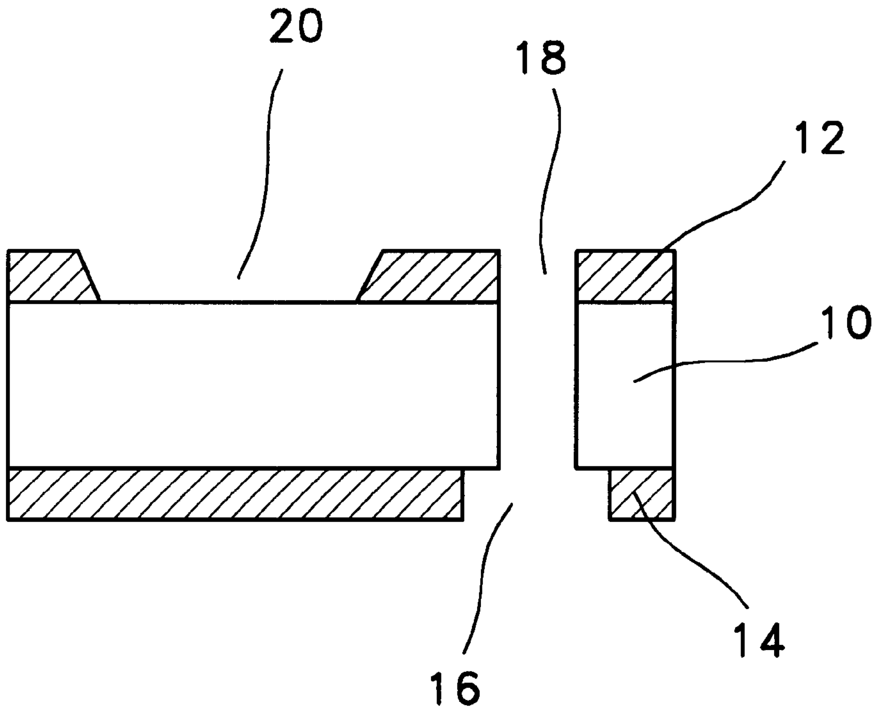
Figure 7:
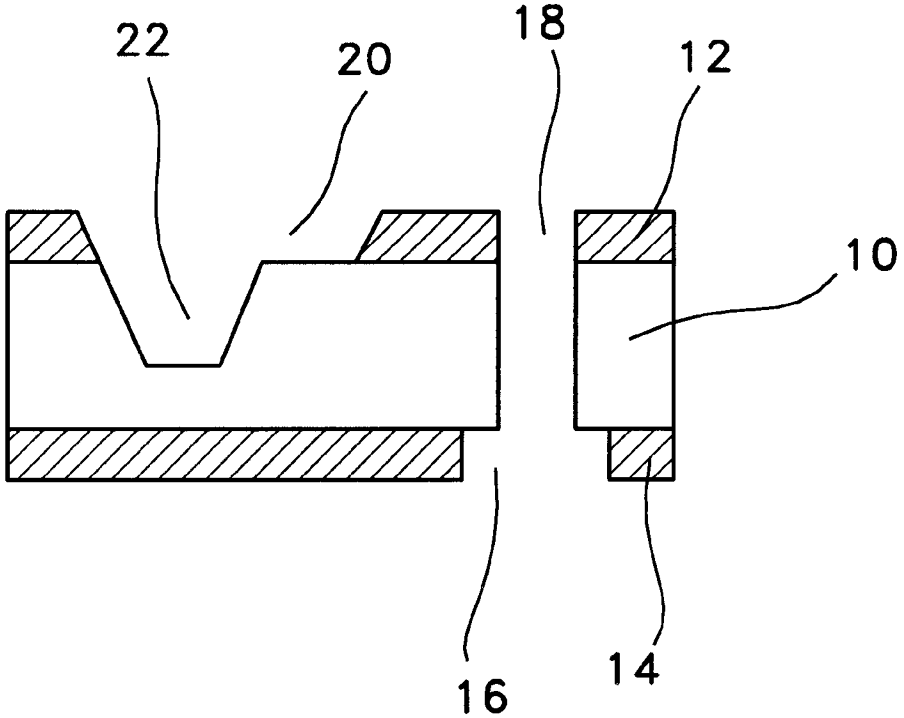
Figure 8:
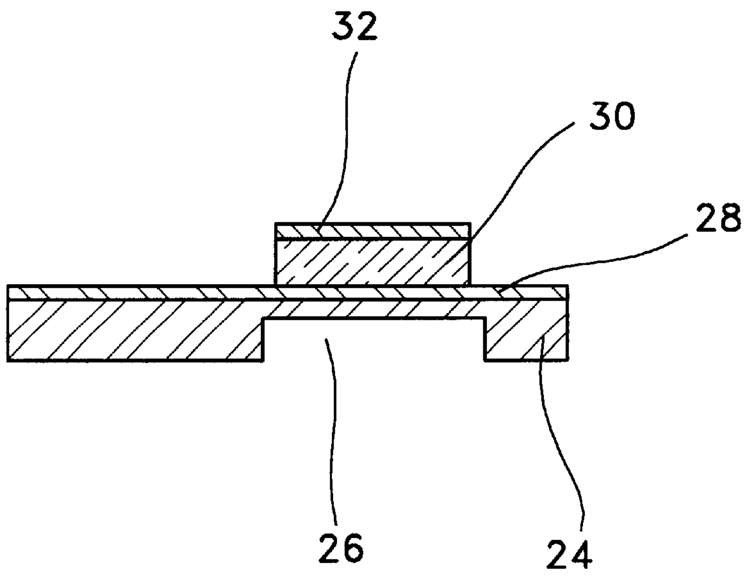
Figure 9:
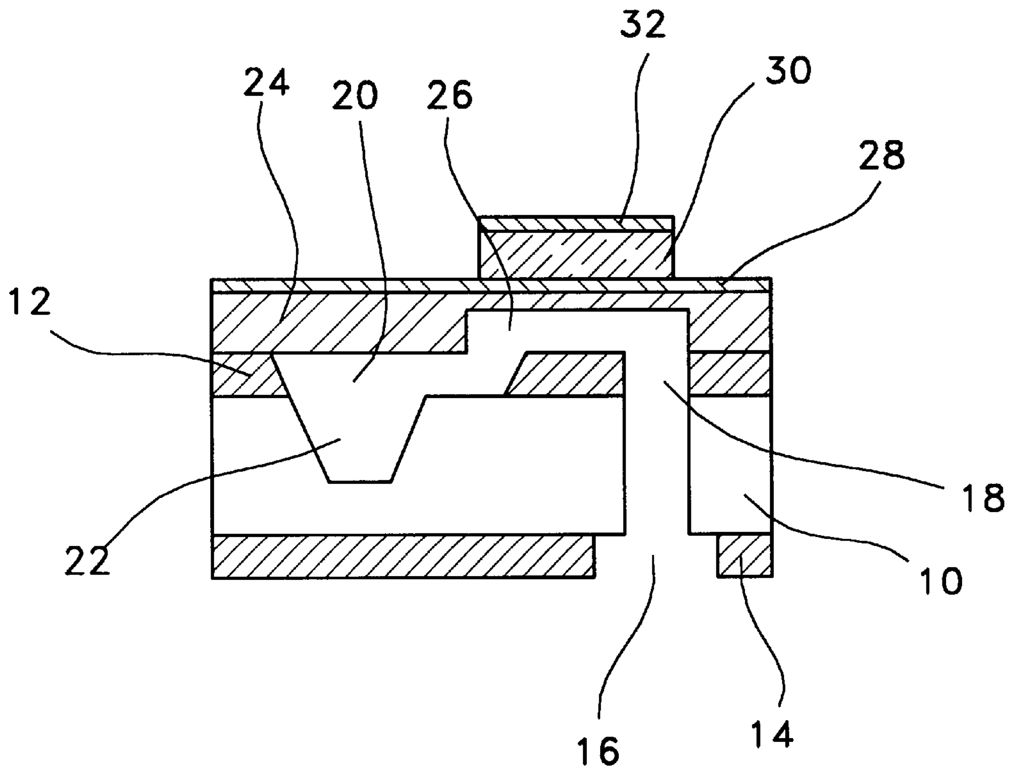
Figure 10:
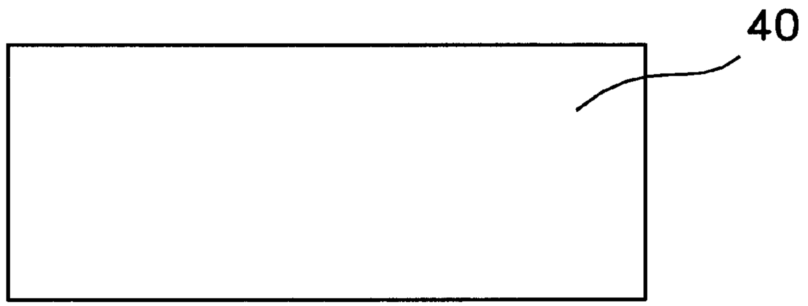
FIG. 10 through FIG. 17 represent flow diagrams showing another example of the present invention.
Figure 11:
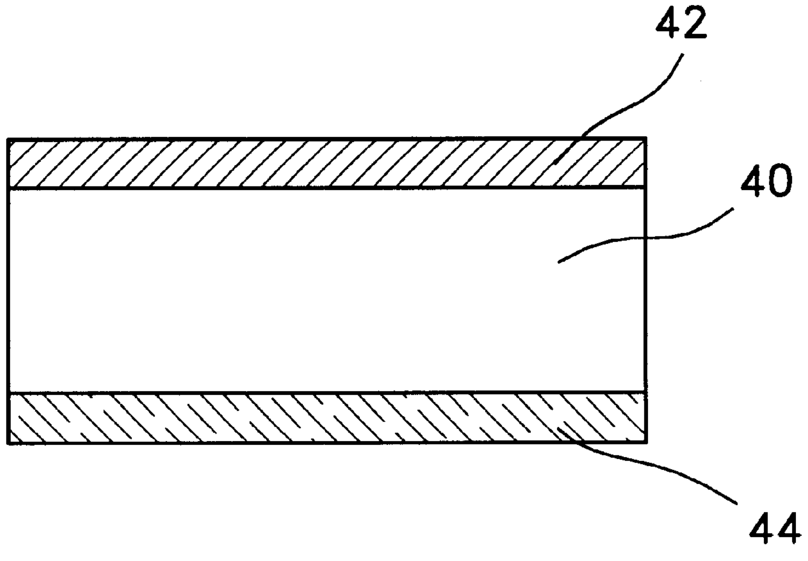
Figure 12:
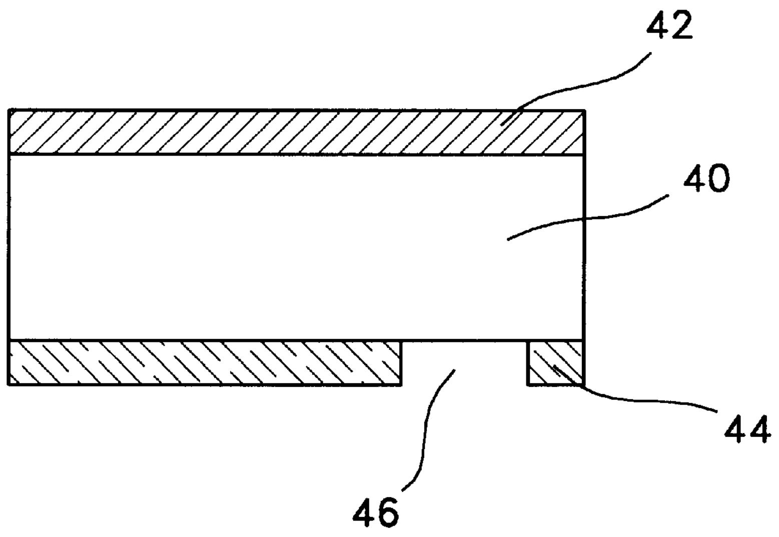
Figure 13:
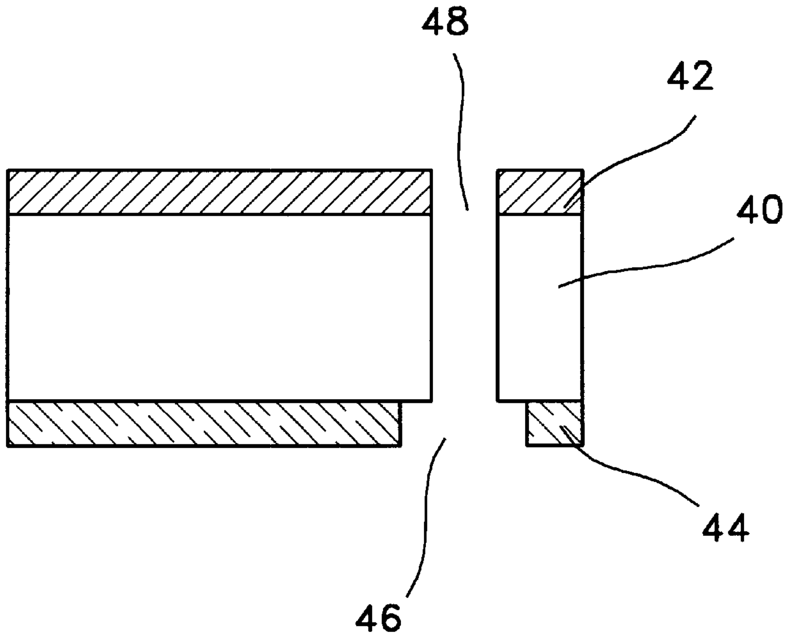
Figure 14:
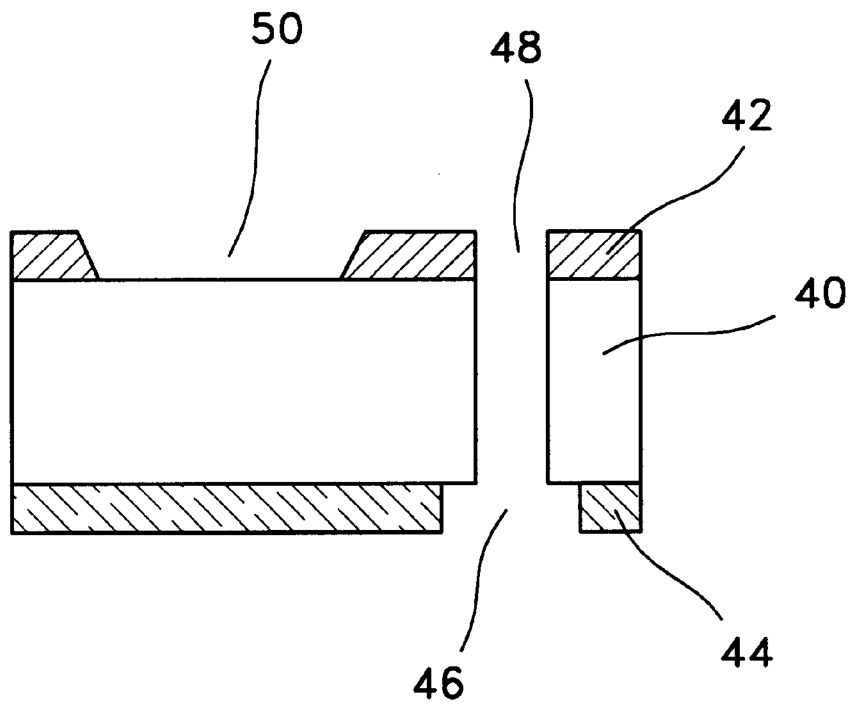
Figure 15:
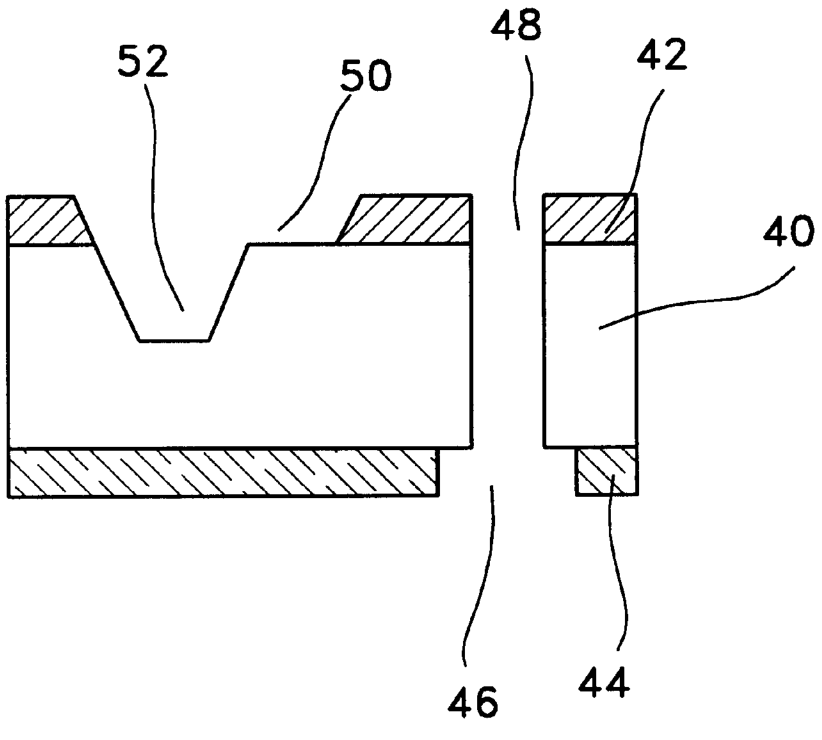
Figure 16:
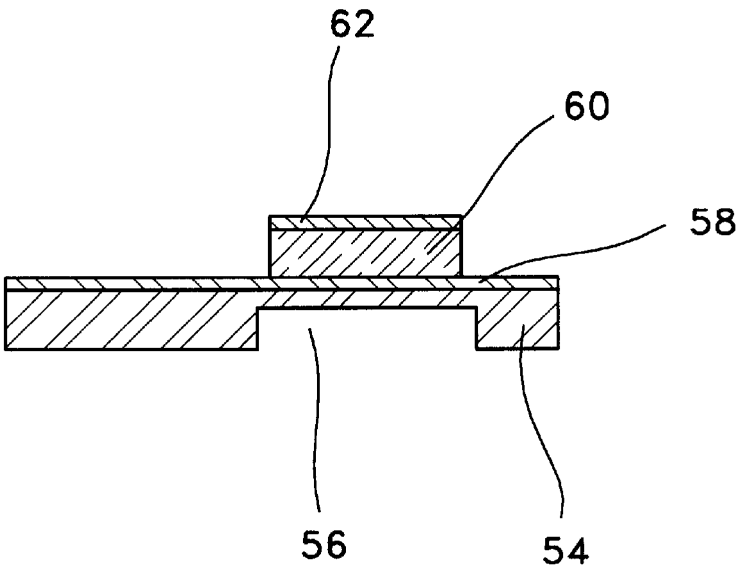
Figure 17:
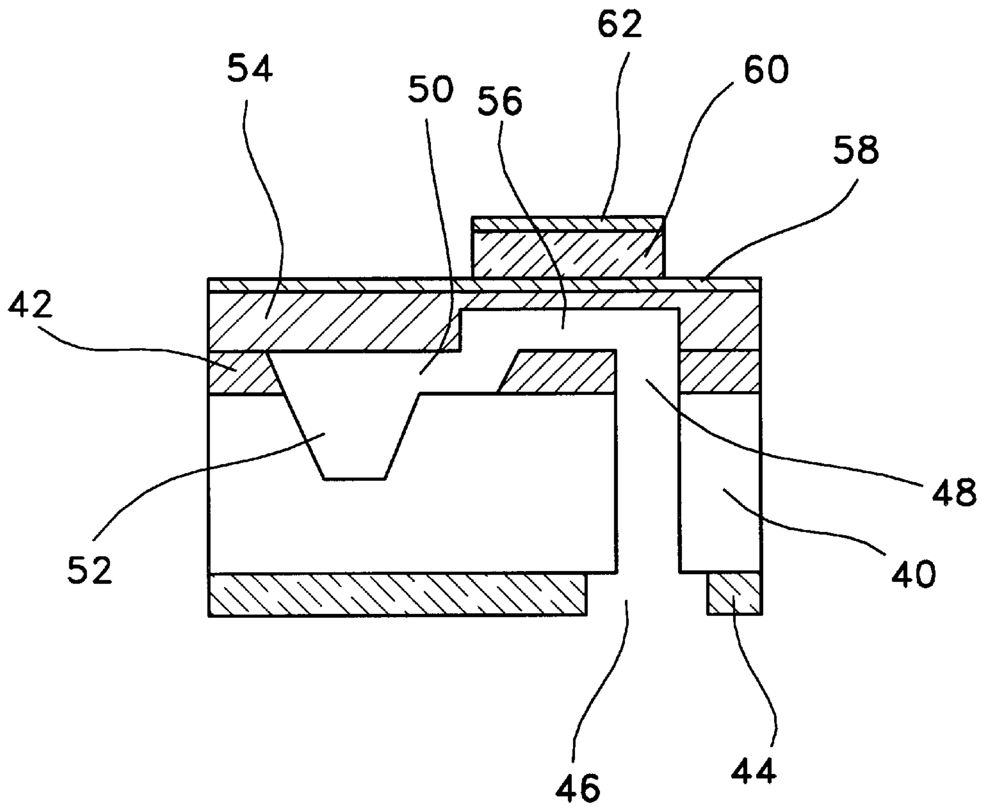
Figure 18:
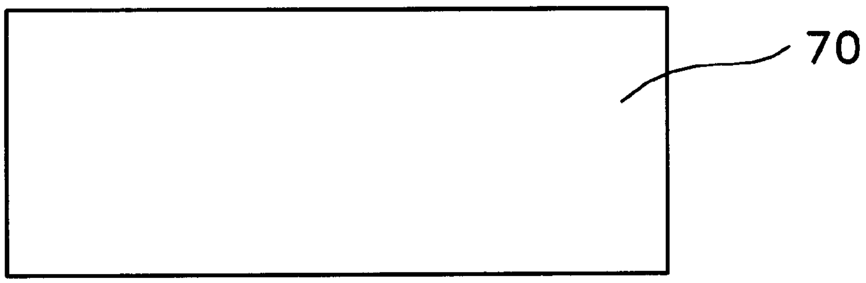
FIG. 18 through FIG. 25 represent flow diagrams showing another example of the present invention.
Figure 19:
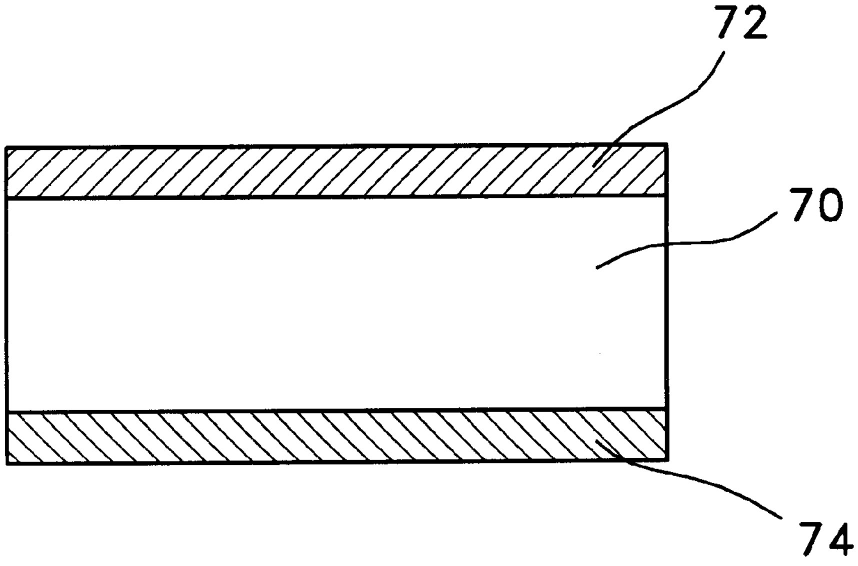
Figure 20:
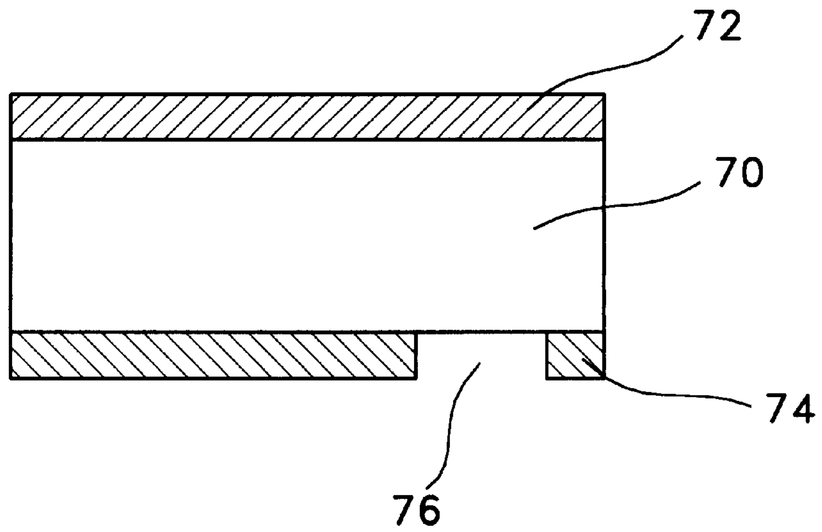
Figure 21:
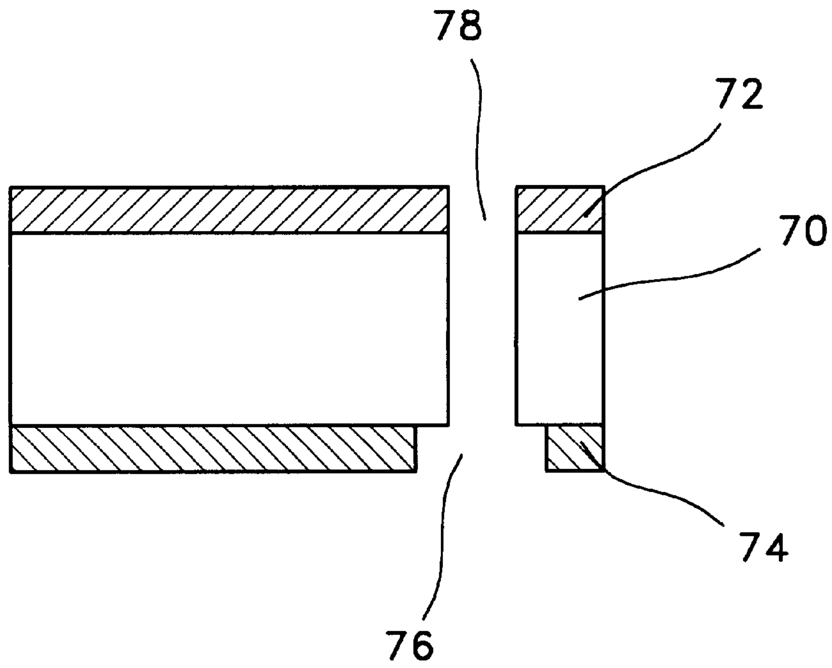
Figure 22:
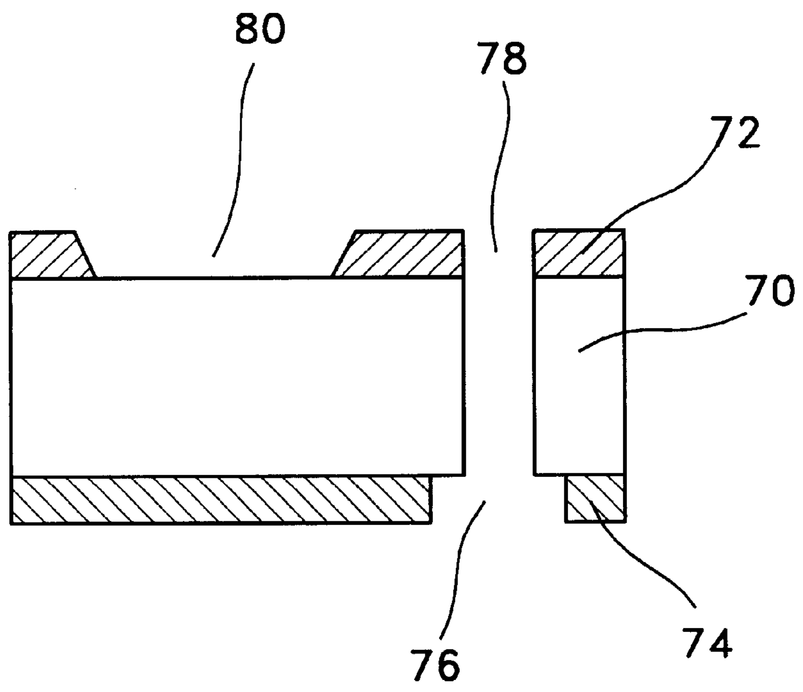
Figure 23:
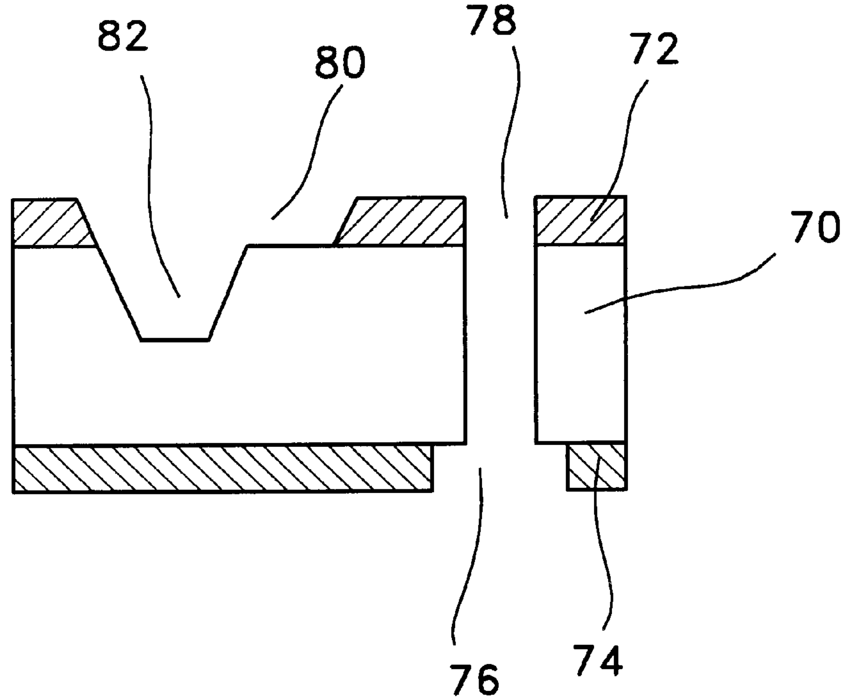
Figure 24:
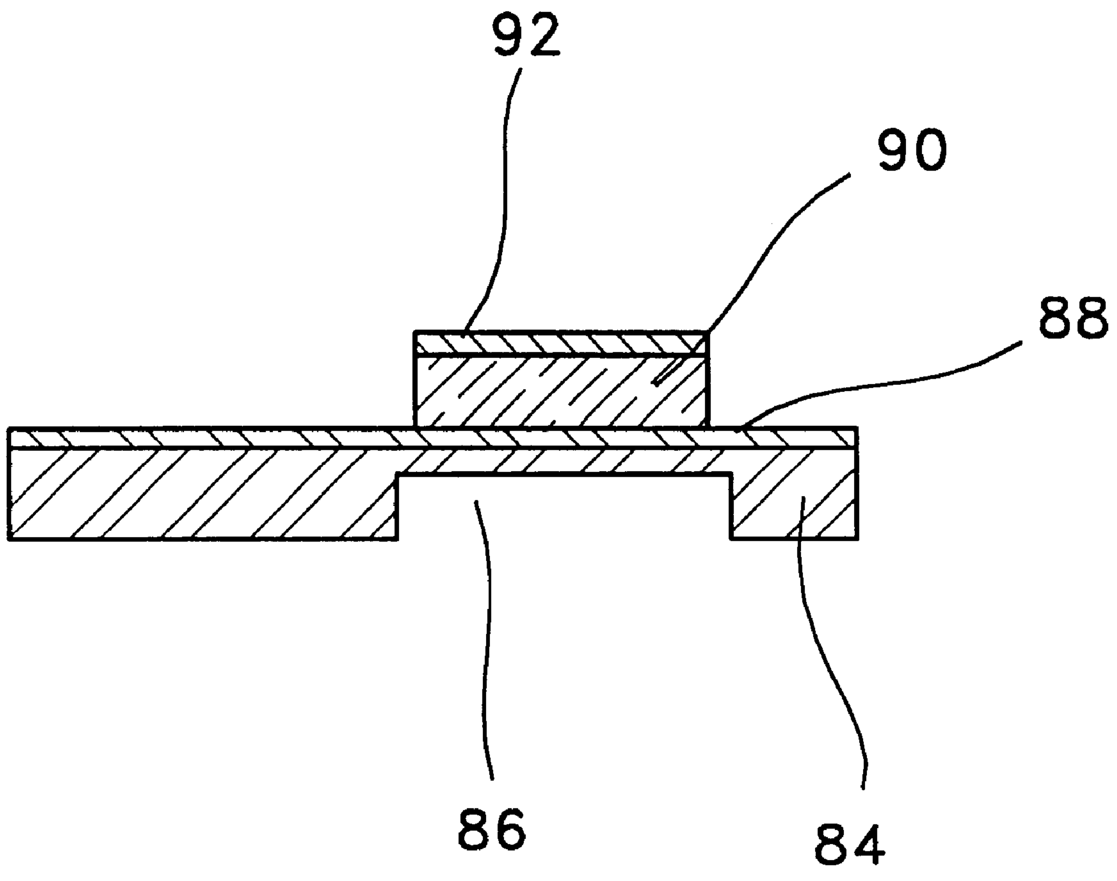
Figure 25:
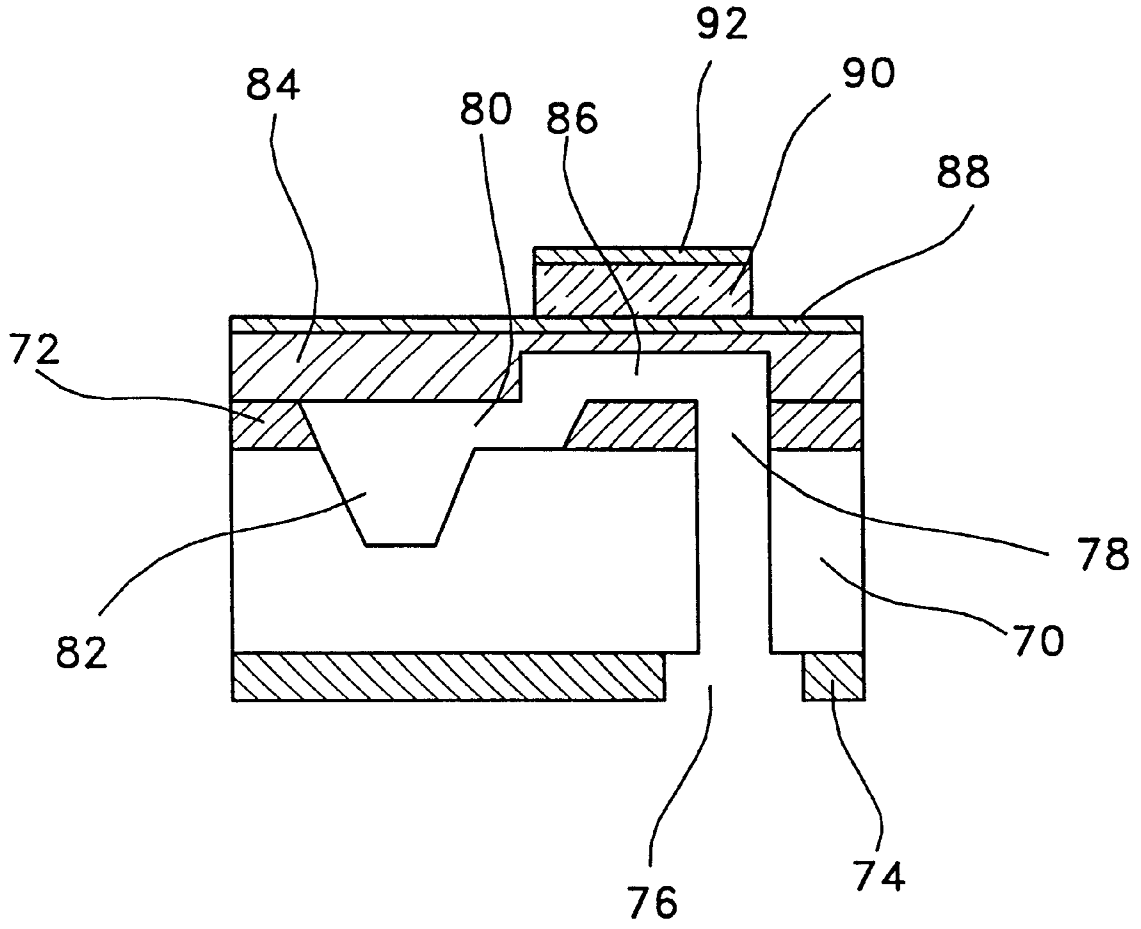
Figure 26:
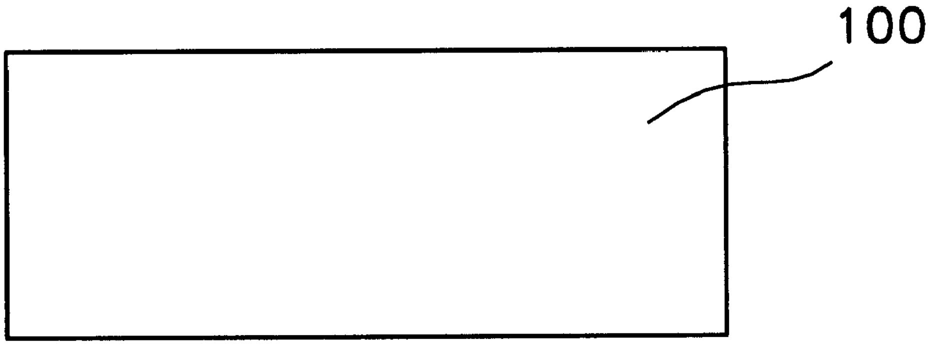
FIG. 26 through FIG. 36 represent flow diagrams showing another example of the present invention.
Figure 27:
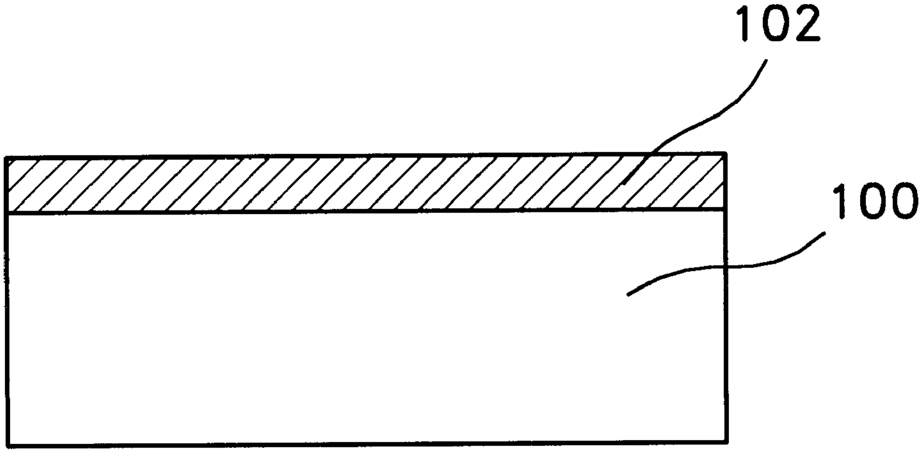
Figure 28:
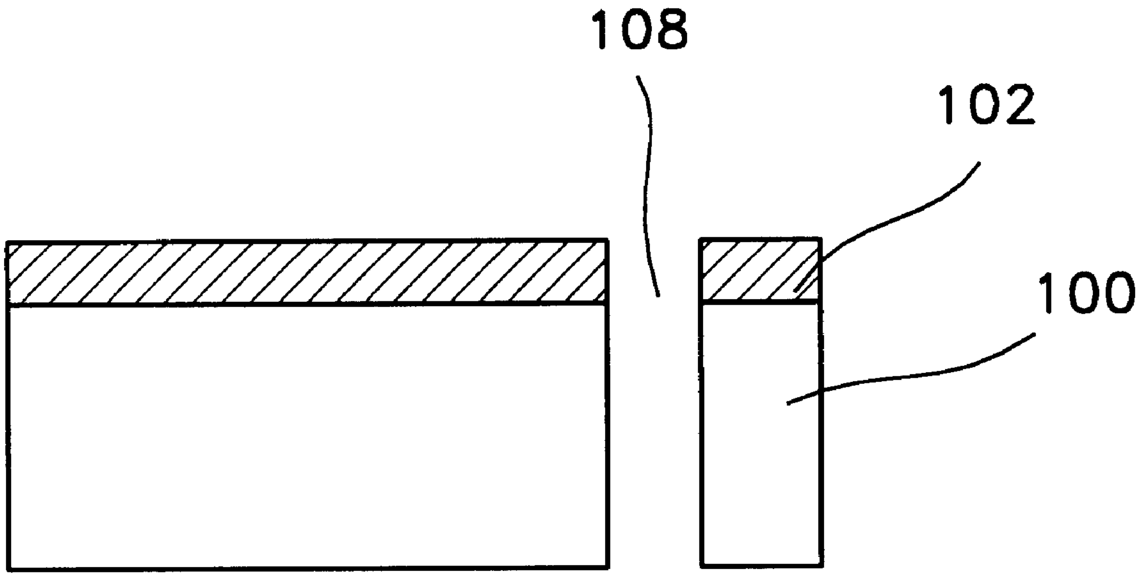
Figure 29:
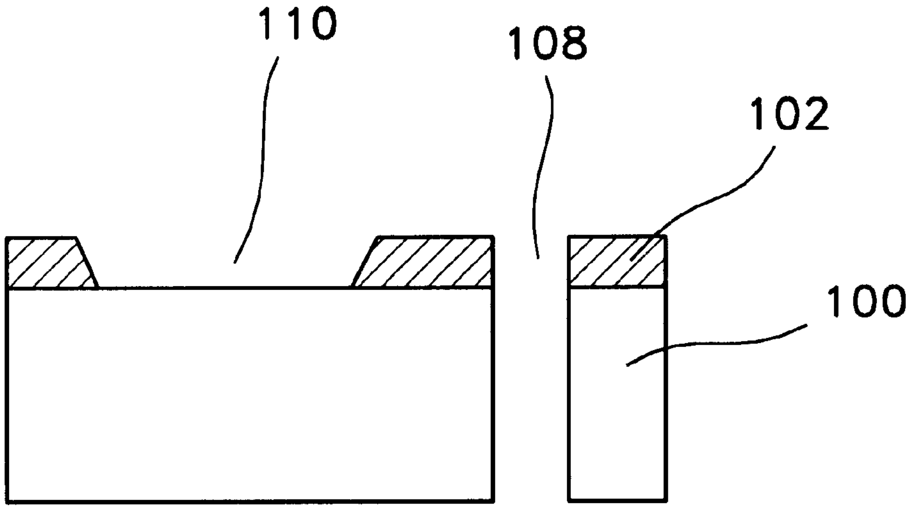
Figure 30:
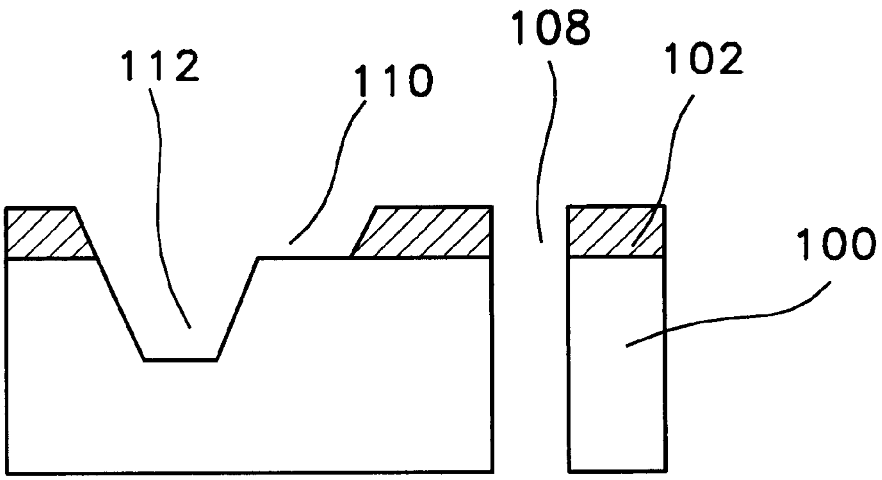
Figure 31:
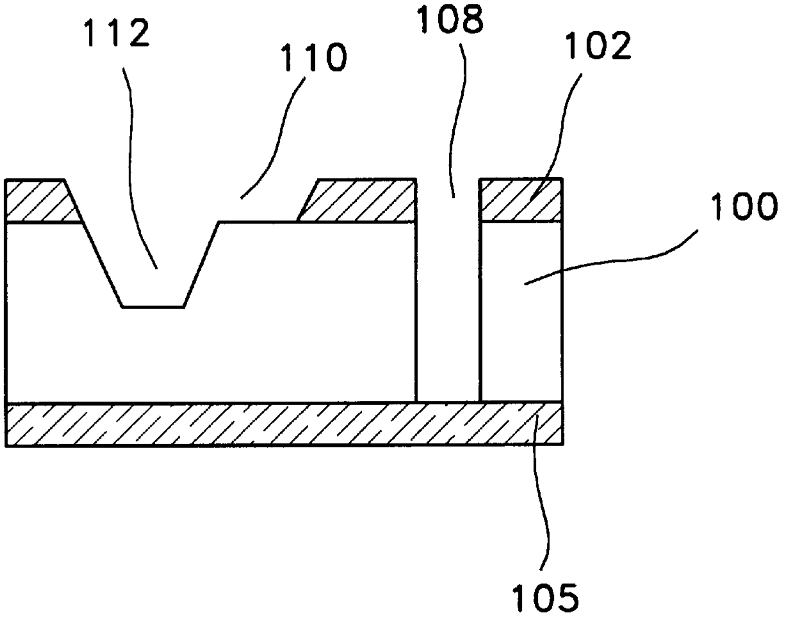
Figure 32:
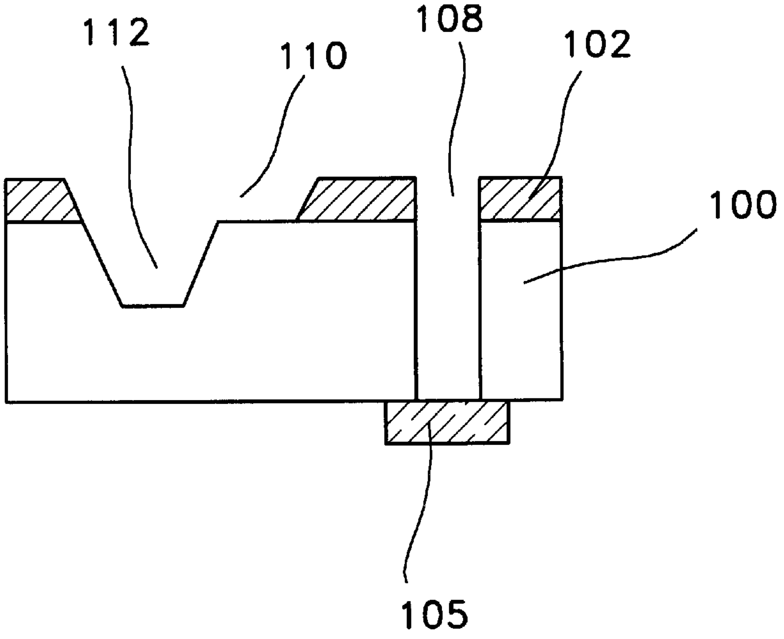
Figure 33:
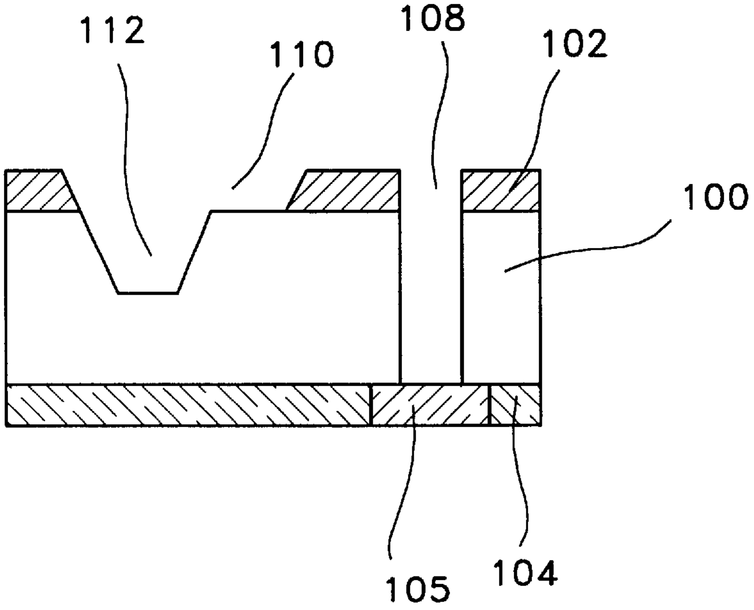
Figure 34:
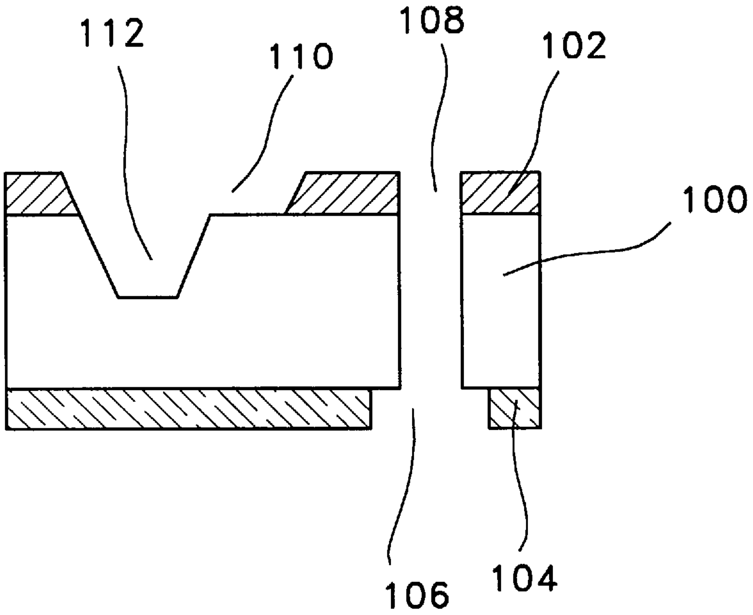
Figure 35:
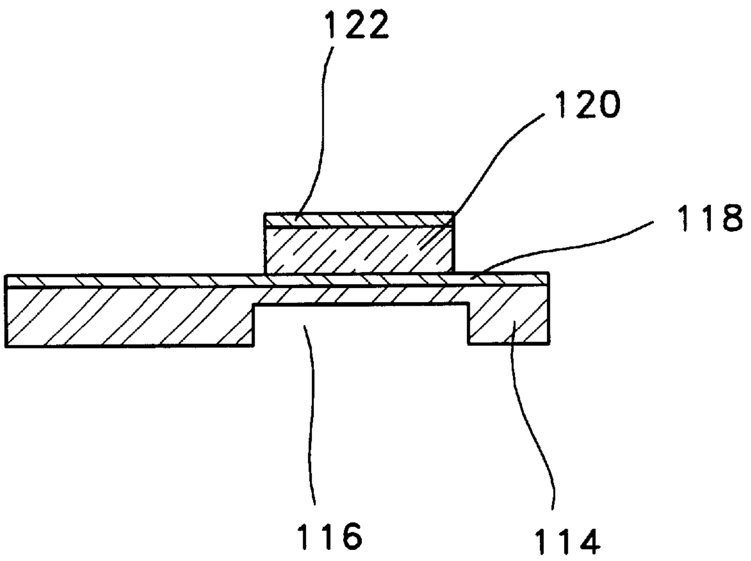
Figure 36:
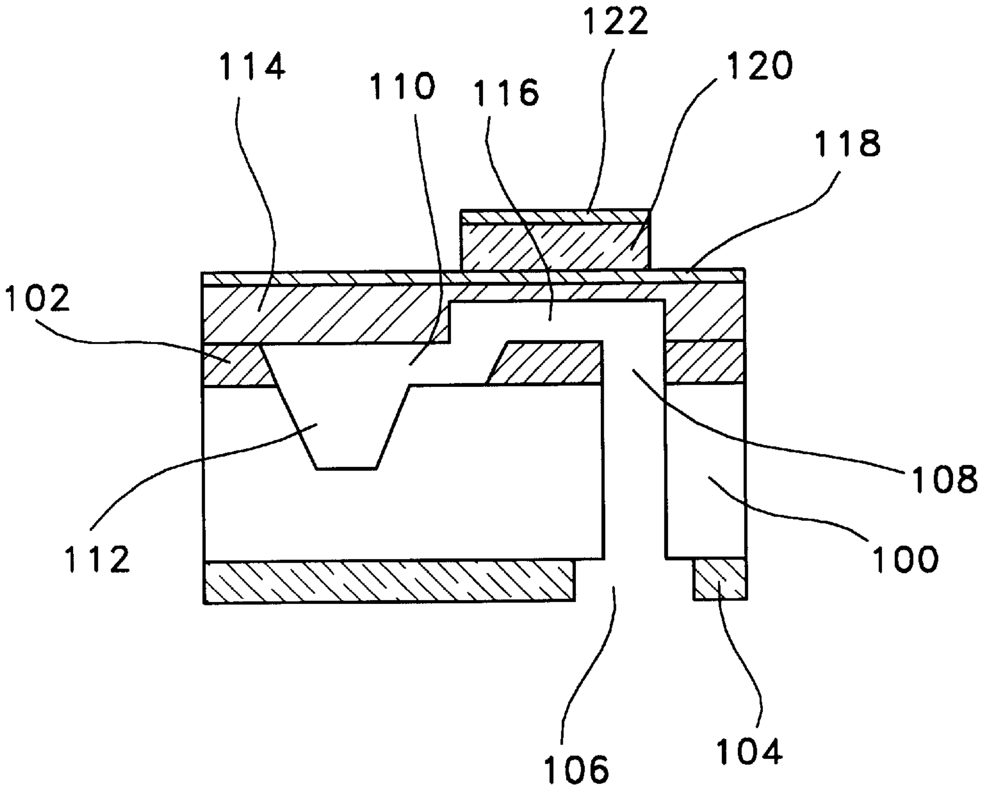

Present invention ink jet printer head manufacture method can be classified into two of which the first method is explained now.

Silicon wafer is used for ink jet printer head body material. Silicon has property of high rigidity in relation to given thickness.

Restrictor plate is formed over the above silicon wafer by doping impurity component and nozzle plate is formed under the silicon wafer.

Nozzle plate may be formed using one of following three methods.

First method forms a doping layer by doping at silicon wafer bottom part. If it is doped to form a foping layer after adding impurity component at silicon wafer bottom part, the layer gets electric characteristics which is different characteristics from that of upper part silicon wafer. The silicon wafer bottom part may be doped simultaneously with the upper part silicon wafer.

Second method forms polysilicon (poly-Si) layer at silicon wafer bottom part. Polysilicon layer is formed by dry process such as sputtering and vapor deposition or by wet process such as sol-gel process.

Third method forms metal layer under silicon wafer by electroplating metal. Ordinary metals may be used for metal layer material but it is preferable to use ink-resistant metal such as nickel (Ni), nickel-chromium (Ni—Cr) or nickel-cobalt-tungsten (Ni—Co—W).

Silicon wafer in between the restrictor plate and the nozzle plate becomes channel plate if the restrictor plate and the nozzle plate have been formed over and under the silicon wafer respectively.

Then nozzle is formed by etching after patterning the nozzle plate formed under the silicon wafer. Whence the channel plate made of the above part silicon wafer can function as etching stop layer because the plate has different material property.

Channel going through the restrictor plate and the channel plate is formed by dry etching after patterning the restrictor plate and the channel plate after forming the nozzle. At this time, the channel may be formed to have uniform width. And the channel may be formed to have two portions of a wide upper portion and a narrow lower portion by patterning the silicon wafer and restrictor plate narrowly, etching the silicon wafer and restrictor plate, then patterning the silicon wafer and restrictor plate widely, and etching the silicon wafer and restrictor plate except the lower end of the silicon wafer. In case that the channel is formed to have two portions which have different width, the fluid resistance is increased at the narrow lower portion. Therefore the vibration occurred after the ink is jetted is diminished rapidly and the frequency property become excellent.

Restrictor is formed by etching after patterning the restrictor plate after forming the channel. At this time also the channel plate made of the silicon wafer can function as etching stop layer because the plate has different material property.

One or more reservers continued to restrictor under the restrictor are formed by etching definite thickness after patterning the channel plate after forming the restrictor. In case that plural reservoirs are formed, the crosstalk between the ink in a chamber and the ink in the reservoir is minimized and the ink is ejected stably. Thus the frequency property is excellent.

In the above procedure it is preferable to perform wet etching using anisotropic etching liquid such as potassium hydroxide {KOH}, trimethylamine hydroxide {TMAH} while dry etching may be done using facility of ICP (inductively coupled plasma) or ICP-RIE (inductively coupled plasma-reaction ion etching) etc.

Ink jet printer head body where restrictor plate, channel plate, nozzle plate, restrictor, reserver, channel and nozzle have been formed is made by the above procedure.

Hydrophile or water repellency treatment may be performed on the side contacting the channel, the nozzle (plate), and the portion where ink is jetted so as to enhance hydrophilia or water repellency though nozzle plate manufactured by the above methods may be used without particular hydrophile or water repellency treatment. Whence it is preferable to use method of making silicon oxide or nitride film on silicon surface or method of metal vapor deposition on silicon surface for hydrophile treatment. And for water repellency treatment it is preferable to use method of doping boron (B) on silicon surface, method of chemically reducing silicon surface, method of treating silicon surface with HF etc., method of film coating of water-repellent polymer after metallization on silicon surface, etc. Electric conductive metal is vapor deposited on silicon surface for metallization where it is preferable to use nickel (Ni), nickel-vanadium (Ni—V) or nickel-chromium (Ni—Cr) among electric conductive metals. PTFE (polytetrafluoroethylene) or Teflon is used for water-repellent polymer where it is preferable to use method of electroplating, spin coating, vapor deposition etc. for polymer film coating.

Actuator where chamber, chamber plate, vibration plate, lower electrode, piezoelectric/electrostrictive film and upper electrode have been formed is separately manufactured. This actuator may be manufactured by generally used method.

Ink jet printer head is completed by binding this separately manufactured actuator to the above ink jet printer head infrastructure.

Ink jet printer head manufactured by the above procedure comprises a channel plate made of silicon wafer; a restrictor plate formed over the silicon wafer by doping impurity component; a nozzle plate formed under the silicon wafer by doping impurity component, electroplating a metal or forming a polysilicon layer; a nozzle formed at the nozzle plate through which nozzle the ink is jetted; a channel going through the channel plate and the restrictor plate which channel is ink path; a restrictor formed at restrictor plate which restrictor maintains ink speed to be constant; one or more reservers continued to restrictor under the restrictor which reservers are formed at a part of the channel plate and in which reservers the ink is reserved; a chamber plate formed upon the restrictor plate; a chamber formed at the chamber plate; a vibration plate formed upon the chamber plate; a lower electrode formed upon the vibration plate; a piezoelectric/electrostrictive film formed upon the lower electrode so that this film actuates when electrified; and an upper electrode formed upon the piezoelectric/electrostrictive film.

Then second manufacture method of present invention ink jet printer head is explained now.

Figure 37:
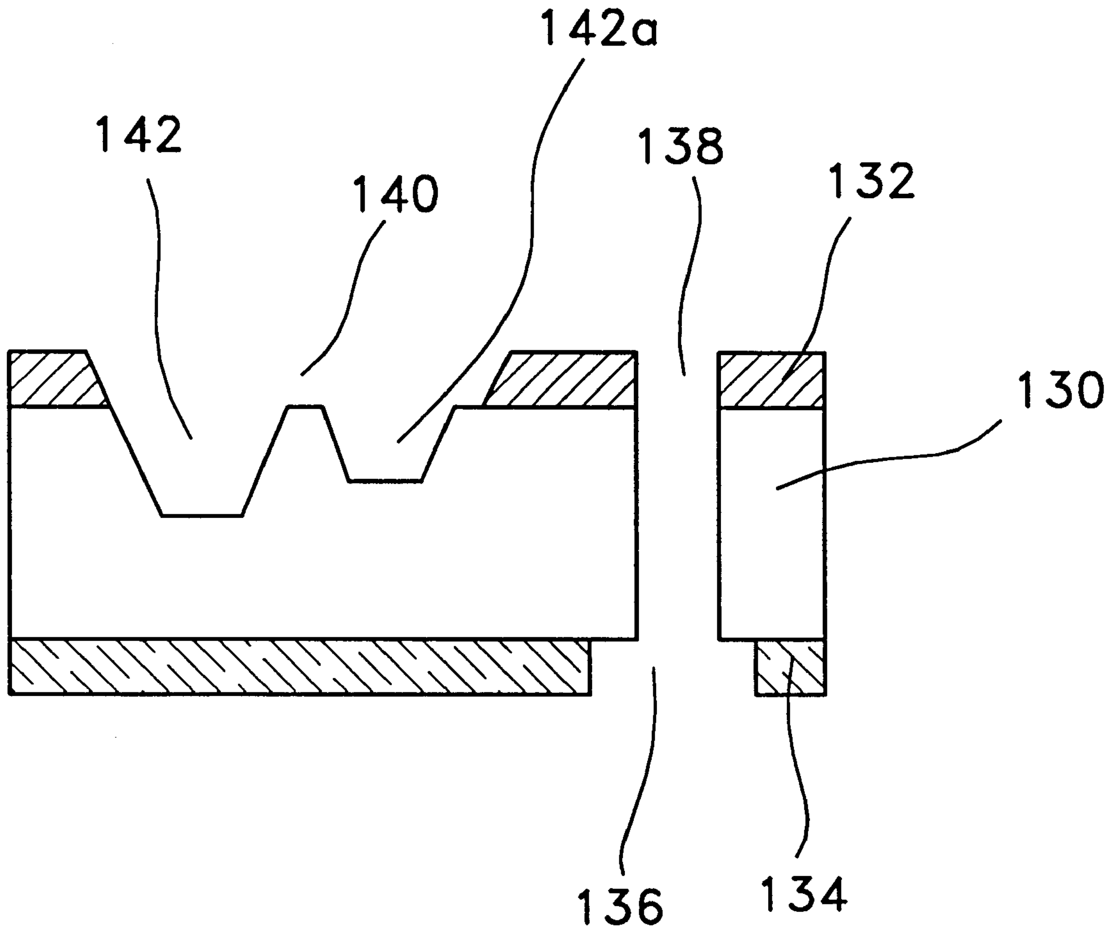
FIG. 37 is a cross section view of another example of the present invention.
Figure 38:
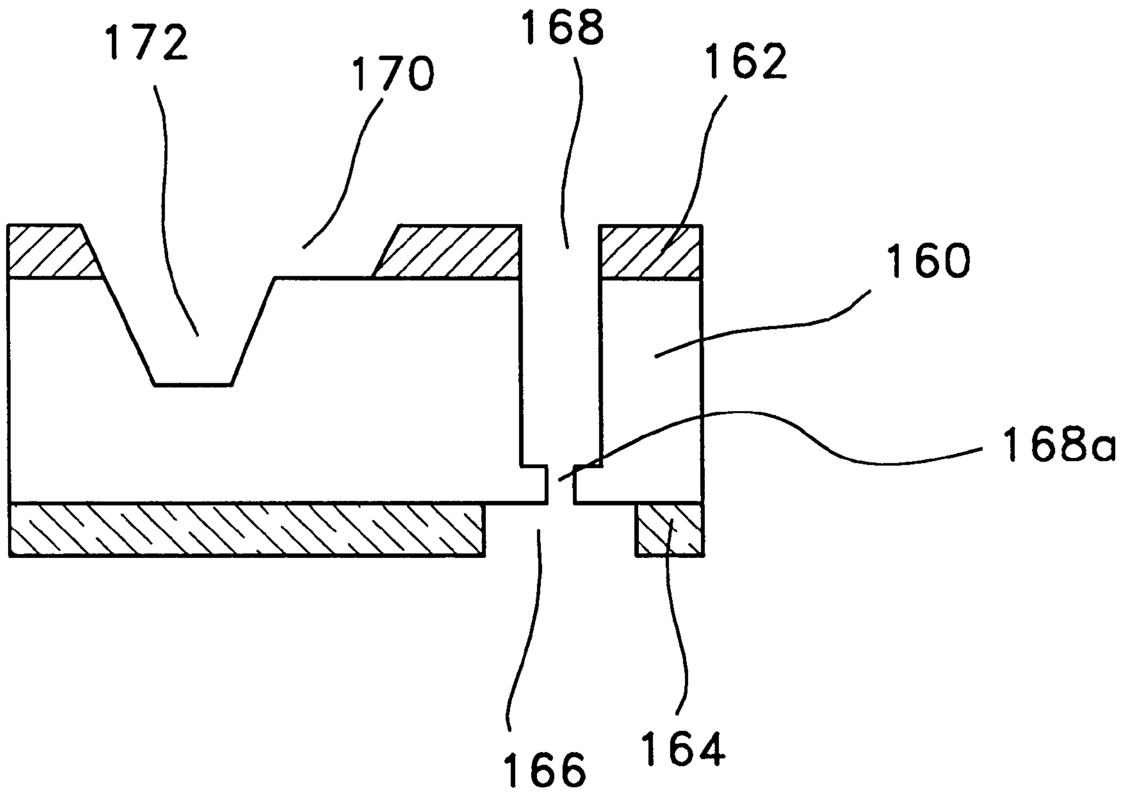
FIG. 38 is a cross section view of another example of the present invention.

FIG. 37 shows an example in which two reservoirs 142 and 142*a* are formed, and FIG. 38 shows an example in which the channel is formed of two portions of a wide upper portion (168) and a narrow lower portion (168*a*). The two portions of the wide upper portion (168) and the narrow lower portion (168*a*) are formed by patterning the silicon wafer 160 and restrictor plate 162 narrowly, etching the silicon wafer 160 and the restrictor plate 162, then patterning the silicon wafer 160 and the restrictor plate 162 widely, and etching the silicon wafer 160 and the restrictor plate 162 except the lower end of the silicon wafer 160.

Channel going through the restrictor plate and the channel plate is formed by dry etching after patterning the restrictor plate and the silicon wafer after forming the restrictor plate. At this time, as described in the first method, the channel may be formed to have uniform width and may be formed to have two portions of a wide upper portion and a narrow lower portion.

Restrictor is formed by etching after patterning the restrictor plate after forming the channel. At this time also the channel plate made of the silicon wafer can function as etching stop layer because the plate has different material property.

One or more reservers continued to restrictor under the restrictor are formed by etching definite thickness after patterning the channel plate after forming the restrictor.

Methods used in etching are same as those described in the above first ink jet printer head manufacture method.

Photoresist layer is formed by laminating dry photoresist under the silicon wafer after forming the reservers. Formed photoresist layer is patterned so that photoresist remain only at the part where nozzle is to be formed.

Nozzle plate is formed by electroplating metal under silicon wafer after patterning the photoresist. At this time also ordinary metals may be used for that metal but it is preferable to use ink-resistant metal such as nickel (Ni), nickel-chromium (Ni—Cr) or nickel-cobalt-tungsten (Ni—Co—W).

Nozzle is formed by removing the remaining photoresist after forming the nozzle plate.

Ink jet printer head body where restrictor plate, channel plate, nozzle plate, restrictor, reserver, channel and nozzle have been formed is made by the above procedure.

Hydrophile or water repellency treatment may be performed on the side contacting the channel, the nozzle (plate), and the portion where ink is jetted so as to enhance hydrophilia or water repellency though nozzle plate manufactured by the above methods may be used without particular hydrophile or water repellency treatment. Methods used in these hydrophile and water repellency treatments are same as those described in the above first ink jet printer head manufacture method.

Actuator where chamber, chamber plate, vibration plate, lower electrode, piezoelectric/electrostrictive film and upper electrode have been formed is separately manufactured. This actuator may be manufactured by generally used method.

Ink jet printer head is completed by binding this separately manufactured actuator to the above ink jet printer head infrastructure.

Ink jet printer head manufactured by the above procedure comprises a channel plate made of silicon wafer; a restrictor plate formed over the silicon wafer by doping impurity component; a nozzle plate formed under the silicon wafer by electroplating a metal; a nozzle formed at the nozzle plate through which nozzle the ink is jetted; a channel going through the channel plate and the restrictor plate which channel is ink path; a restrictor formed at restrictor plate which restrictor maintains ink speed to be constant; one or more reservers continued to restrictor under the restrictor which reservers are formed at a part of the channel plate and in which reservers the ink is reserved; a chamber plate formed upon the restrictor plate; a chamber formed at the chamber plate; a vibration plate formed upon the chamber plate; a lower electrode formed upon the vibration plate; a piezoelectric/electrostrictive film formed upon the lower electrode so that this film actuates when electrified; and an upper electrode formed upon the piezoelectric/electrostrictive film.

Part material precision is improved by present invention ink jet printer head manufacture method because process to adfix and assemble of each part is not necessary. Therefore high precision design of each component part such as reserver, restrictor, channel and nozzle is feasible.

And large area mass production application is feasible because silicon batch process is used; and ink jet part and channel side surface of nozzle plate can be controlled of surface characteristics by hydrophile or water repellency treatment.

And there is effect to be able to get high quality ink jet printer head because product reliability is enhanced according as whole ridigity of parts composing the present invention ink jet printer head is increased.

Now present invention examples are explained referring to drawing. But the following application examples are only illustrations of this invention and do not confine extent of this invention.

FIG. 2 through FIG. 9 show an example of method for manufacturing ink jet printer head of present invention.

Restrictor plate 12 and nozzle plate 14 are formed by doping at top and bottom of silicon wafer 10 respectively. Whence silicon wafer 10 in between restrictor plate 12 and nozzle plate 14 becomes channel plate.

Then nozzle 16 is formed by etching after patterning the nozzle plate 14. After forming the nozzle 16, channel 18 going through restrictor plate 12 and silicon wafer 10 is formed by dry etching after patterning the restrictor plate 12 and the silicon wafer 10 that becomes channel plate.

Restrictor 20 is formed by etching after patterning the restrictor plate 12 after forming the channel 18. Reserver 22 continued to restrictor 20 under restrictor 20 is formed by etching definite thickness after patterning the silicon wafer 10 after forming the restrictor 20.

Actuator where chamber 26, chamber plate and vibration plate 24, lower electrode 28, piezoelectric/electrostrictive film 30 and upper electrode 32 have been formed is separately manufactured.

Ink jet printer head is completed by binding this separately manufactured actuator to the above ink jet printer head infrastructure.

FIG. 10 through FIG. 17 show another example of method for manufacturing ink jet printer head of present invention.

Restrictor plate 42 is formed by doping at top of silicon wafer 40. And nozzle plate 44 is formed by electroplating metal under silicon wafer 40. Whence silicon wafer 40 in between restrictor plate 42 and nozzle plate 44 becomes channel plate.

Then nozzle 46 is formed by etching after patterning the nozzle plate 44. After forming the nozzle 46, channel 48 going through restrictor plate 42 and silicon wafer 40 is formed by dry etching after patterning the restrictor plate 42 and the silicon wafer 40.

Restrictor 50 is formed by etching after patterning the restrictor plate 42 after forming the channel 48. Reserver 52 continued to restrictor 50 under restrictor 50 is formed by etching definite thickness after patterning the silicon wafer 40 after forming the restrictor 50.

Actuator where chamber 56, chamber plate and vibration plate 54, lower electrode 58, piezoelectric/electrostrictive film 60 and upper electrode 62 have been formed is separately manufactured.

Ink jet printer head is completed by binding this separately manufactured actuator to the above ink jet printer head infrastructure.

FIG. 18 through FIG. 25 show more another example of method for manufacturing ink jet printer head of present invention.

Restrictor plate 72 is formed by doping at top of silicon wafer 70. And nozzle plate 74 made of polysilicon is formed under silicon wafer 70. Whence silicon wafer 70 in between restrictor plate 72 and nozzle plate 74 becomes channel plate.

Then nozzle 76 is formed by etching after patterning the nozzle plate 74. After forming the nozzle 76, channel 78 going through restrictor plate 72 and silicon wafer 70 is formed by dry etching after patterning the restrictor plate 72 and the silicon wafer 70.

Restrictor 80 is formed by etching after patterning the restrictor plate 72 after forming the channel 78. Reserver 82 continued to restrictor 80 under restrictor 80 is formed by etching definite thickness after patterning the silicon wafer 70 after forming the restrictor 80.

Actuator where chamber 86, chamber plate and vibration plate 84, lower electrode 88, piezoelectric/electrostrictive film 90 and upper electrode 92 have been formed is separately manufactured.

Ink jet printer head is completed by binding this separately manufactured actuator to the above ink jet printer head infrastructure.

FIG. 26 through FIG. 36 show again another example of method for manufacturing ink jet printer head of present invention.

Restrictor plate 102 is formed by doping at top of silicon wafer 100. And nozzle plate 104 made of polysilicon is formed under silicon wafer 100. Channel 108 going through restrictor plate 102 and silicon wafer 100 is formed by dry etching after patterning the restrictor plate 102 and the silicon wafer 100.

Restrictor 110 is formed by etching after patterning the restrictor plate 102 after forming the channel 108. Reserver 112 continued to restrictor 110 under restrictor 110 is formed by etching definite thickness after patterning the silicon wafer 100 after forming the restrictor 110.

Photoresist layer 105 is formed by laminating dry photoresist under the silicon wafer 100. Formed photoresist layer 105 is patterned so that photoresist remain only at the part where nozzle is to be formed.

Nozzle plate 104 is formed by electroplating metal under silicon wafer 100 after patterning the photoresist. Whence silicon wafer 100 in between restrictor plate 102 and nozzle plate 104 becomes channel plate.

Nozzle 106 is formed by removing the photoresist 105 after forming the nozzle plate 104.

Actuator where chamber 116, chamber plate and vibration plate 114, lower electrode 118, piezoelectric/electrostrictive film 120 and upper electrode 122 have been formed is separately manufactured.

Ink jet printer head is completed by binding this separately manufactured actuator to the above ink jet printer head infrastructure.

FIG. 37 shows an example in which two reservoirs 142 and **142*a* are formed, and FIG. 38 shows an example in which the channel is formed of two portions of a wide upper portion (168) and a narrow lower portion (168*a***).

What is claimed is:

1. A method of making ink jet printer head body comprising the steps of:
   - providing a silicon wafer;
   - forming a restrictor plate over the silicon wafer by doping an impurity component;
   - forming a nozzle plate under the silicon wafer by doping an impurity component;
   - forming a nozzle by etching after the forming of the nozzle plate;
   - forming a channel going through the restrictor plate, wherein the channel is formed of two portions of a wide upper portion and a narrow lower portion by patterning the silicon wafer and the restrictor plate narrowly, etching the silicon wafer and the restrictor plate, then patterning the silicon wafer and the restrictor plate widely, and etching the silicon wafer and the restrictor plate except a lower end of the silicon wafer;

forming a restrictor at the restrictor plate by etching after the patterning of the silicon wafer and the restrictor plate; and forming one or more reservers continued to the restrictor and under the restrictor by etching a definite thickness after the patterning of the silicon wafer and the restrictor plate.

2. The method of claim 1, wherein the method further comprises a step of a hydrophile treatment of one or more of the restrictor plate, the nozzle plate, the channel, the restrictor and the reservers for contacting ink.

3. The method of claim 2, wherein a method for the hydrophile treatment is one of a method of making silicon oxide or a nitride film, and a method of metal vapor deposition on a silicon surface of the wafer.

4. The method of claim 1, wherein the method further comprises a step of a water repellency treatment of one or more of the restrictor plate, the nozzle plate, the channel, the restrictor and the reservers for contacting ink.

5. The method of claim 4, wherein a method for the water repellency treatment is one of a method of doping boron on a silicon surface of the wafer, a method of chemically reducing the silicon surface, a method of treating the silicon surface with HF, and a method of film coating of a water-repellent polymer after metallization on the silicon surface.

6. A method of making ink jet printer head comprising the steps of:

providing a silicon wafer;

forming a restrictor plate over the silicon wafer by doping an impurity component;

forming a nozzle plate under the silicon wafer by doping an impurity component;

forming a nozzle by etching after the forming of the nozzle plate;

forming a channel going through the restrictor plate and the silicon wafer by etching after the forming of the restrictor plate, wherein the channel is formed of two portions of a wide upper portion and a narrow lower portion by patterning the silicon wafer and restrictor plate narrowly, etching the silicon wafer and restrictor plate, then patterning the silicon wafer and restrictor plate widely, and etching the silicon wafer and restrictor plate except the lower end of the silicon wafer;

forming a restrictor at the restrictor plate by etching after the patterning of the silicon wafer and the restrictor plate;

forming one or more reservers continued to the restrictor and under the restrictor by etching a definite thickness after the patterning of the silicon wafer and the restrictor plate;

separately forming an actuator composed of an upper electrode, a piezoelectric/electrostrictive film, a lower electrode, a vibration plate, a chamber and a chamber plate; and bonding the restrictor plate and the actuator.

7. The method of claim 6, wherein the method further comprise a step of hydrophile treatment of one or more of the restrictor plate, the nozzle plate, the channel, the restrictor and the reservers for contacting ink.

8. The method of claim 7, wherein a method for the hydrophile treatment is one of a method of making silicon oxide or a nitride film, and a method of metal vapor deposition on a silicon surface of the wafer.

9. The method of claim 6, wherein the method further comprises a step of a water repellency treatment of one or more of the restrictor plate, the nozzle plate, the channel, the restrictor and the reservers for contacting ink.

10. The method of claim 9, wherein a method for the water repellency treatment is one of a method of doping boron on a silicon surface of the wafer, a method of chemically reducing the silicon surface, a method of treating the silicon surface with HF, and a method of film coating a water-repellent polymer after metallization on the silicon surface.

* * * * *

UNITED STATES PATENT AND TRADEMARK OFFICE

CERTIFICATE OF CORRECTION

PATENT NO. : 6,594,898 B1
DATED : July 22, 2003
INVENTOR(S) : Sang Kyeong Yun

It is certified that error appears in the above-identified patent and that said Letters Patent is hereby corrected as shown below:

Title page,
Item [56], References Cited, FOREIGN PATENT DOCUMENTS, change "8/1999" to -- 8/1989 --.

Signed and Sealed this

Twenty-seventh Day of April, 2004

JON W. DUDAS
*Acting Director of the United States Patent and Trademark Office*